United States Patent [19]

Lam et al.

[11] 4,456,841

[45] Jun. 26, 1984

[54] FIELD EFFECT LEVEL SENSITIVE CIRCUIT

[75] Inventors: Chung H. Lam, Williston; Charles W. Peterson, Jr., Essex Junction, both of Vt.

[73] Assignee: International Business Machines Corporation, Armonk, N.Y.

[21] Appl. No.: 346,431

[22] Filed: Feb. 5, 1982

[51] Int. Cl.³ .................... H03K 3/023; H03K 3/353; G01R 19/165; G11C 7/06
[52] U.S. Cl. .................... 307/530; 307/279; 307/358; 365/104; 365/208
[58] Field of Search .............. 307/530, 279, 290, 358; 365/103, 104, 207, 208, 205

[56] References Cited

U.S. PATENT DOCUMENTS

| | | | |
|---|---|---|---|
| 3,873,856 | 3/1975 | Gerlach et al. | 307/279 |
| 3,882,331 | 5/1975 | Sasaki | 307/279 |
| 4,048,524 | 9/1977 | Laugesen et al. | 307/304 |
| 4,063,119 | 12/1977 | Odell et al. | 307/279 |
| 4,071,784 | 1/1978 | Maeder et al. | 307/279 |
| 4,242,604 | 12/1980 | Smith | 307/443 |
| 4,274,147 | 6/1981 | Padgett et al. | 307/530 X |
| 4,375,039 | 2/1983 | Yamauchi | 307/530 |

OTHER PUBLICATIONS

K. Kiuchi et al., "A 65 mW 128K EB-ROM", IEEE Journal of Solid-State Circuits, vol. SC-14, No. 5, Oct. 1979, pp. 855–859.
Y. Kitano et al., "A 4-Mbit Full-Wafer ROM", IEEE Journal of Solid-State Circuits, vol. SC-15, No. 4, Aug. 1980, pp. 686–693.
H. Kalter et al., "High Noise Immunity Column . . . ", IBM Technical Disclosure Bulletin, vol. 23, No. 6, Nov. 1980, pp. 2250–2254.

Primary Examiner—Larry N. Anagnos
Attorney, Agent, or Firm—Howard J. Walter, Jr.

[57] ABSTRACT

A level sensitive switching circuit particularly useful as a data detecting sense amplifier for a Read-Only Memory integrated circuit. The switching circuit includes a pair of IGFET inverter circuits coupled between a drain supply voltage and a common voltage node. The signal to be sensed is applied to the input of the first inverter, the output of which is the circuit output. Two feedback loops are established between the output of the first inverter and the source electrode of an IGFET input device in the first inverter. The first feedback loop includes a source follower responsive to the output of the first inverter and the second feedback loop includes the second inverter having its output coupled to the gate of one of two series-connected devices between the common voltage node and the source supply voltage. The other series-connected device is responsive to an amplifier set clock pulse to selectively enable the circuit.

8 Claims, 3 Drawing Figures

FIELD EFFECT LEVEL SENSITIVE CIRCUIT

BACKGROUND OF THE INVENTION

1. Field of the Invention

This invention relates to level sensitive circuits fabricated in integrated circuit technology and more particularly to level sensitive circuits useful as data sense amplifiers in MOSFET Read Only Memory (ROM) array integrated circuits.

2. Description of the Prior Art

Level sensitive data sensing circuits used in ROM integrated circuit devices are designed to detect data signals resulting from the presence or absence of a selected device located within a matrix of addressable switching devices. In IGFET ROM Devices the presence or absence of an addressed IGFET causes the potential of a bit sense line either to remain at a preselection set potential or to be charged toward one of the device supply voltage levels. The time required to address a selected memory cell location and determine its effect on a bit sense line is critical to the usefulness of the ROM. This time is highly dependent upon a number of circuit parameters including device sizes, voltage supply levels, parasitic circuit capacitances and response time of data sensing circuits. Many ROM circuit designs rely on the performance of a simple inverter coupled to a precharged data bit sense, or bit line, as a sense amplifier. Other designs, for example see the article "A 4-Mbit Full-Wafer ROM", by Y. Kitano et al, IEEE Journal of Solid-State Circuits, Vol. SC-15, pp. 686-693, Aug. 1980, use a clock-responsive inverter circuit in which a pre-charged data line must be discharged from a drain supply voltage level to the treshold voltage of an IGFET. More complicated designs avoid the relatively long discharge time of the bit lines by using an inverter having a high logic threshold switching point so that the bit line is not required to fully discharge prior to sensing. See, for example, FIG. 4. of the article "A 65 mW 128K EB-ROM", by K. Kiuchi et al, IEEE Journal of Solid-State Circuits, Vol. SC-14, pp. 855-859, Oct. 1979. This high threshold inverter circuit, although potentially reducing the time required to sense changes in the data bit line, uses a number of clock signals requiring critical sequencing in order to avoid erroneous reading of data. In addition, the transistion time of the enabling pulse is also critical, since if it rises too quickly, a high level signal will be read regardless of the voltage on the data bit line. Yet another level sensitive ROM array sensing circuit is taught in the article, "High Noise Immunity Column Select/Sense Amplifier Circuit", by H. L. Kalter et al, IBM Technical Disclosure Bulletin, Vol. 23, pp. 2250-2254, Nov. 1980. Here a level sensitive Schmitt-Trigger circuit is combined with a logic enabling clock pulse which must be coincident with the appearance of the data input signal to provide proper operation of the circuit.

Various additional level sensitive circuits are known in the art. U.S. Pat. No. 3,873,856 to Gerlach is of interest as it teaches a number of equivalent circuits, all of which include the use of feedback of an inverted input signal to the source electrode of an input IGFET which tends to increase the gate to source voltage, and thus increase the rate of change in drain current, in response to an increasing input signal and to decrease the gate to source voltage in response to a decreasing input signal. Feedback to the source electrode of an input device may be implemented in various ways. Maeder et al, in U.S. Pat. No. 4,071,784, teaches the use of a depletion mode source follower or a resistor to provide continuous feedback for all levels of input voltage. Such circuits tend to provide little choice in the point at which the input signal causes the output to change.

U.S. Pat. No. 3,882,331 to Sasaki teaches a level sensitive trigger circuit in which a voltage divider is provided between the input and output of a hysteresis circuit so that the input level switching point is a function of both the input and output voltage.

U.S. Pat. No. 4,048,524 to Laugesen et al is also of interest as it teaches a level sensitive circuit in which multiple trip points are used to sense power supply variations. U.S. Pat. No. 4,063,119 to Odell is of interest as it teaches the use of two independent output-responsive feedback circuits for seperately establishing the circuit trip point and the levels of the output signal. U.S. Pat. No. 4,242,604 to Smith is of interest as it teaches a level sensitive circuit which includes compensation for changes in device parameters so that the trip point is a fixed value.

It is the purpose of the subject invention to avoid the problems of the prior art and to provide a level sensitive circuit which has the ability to sense voltages at various levels with improved switching speed without the requirement of complicated clocking schemes.

SUMMARY OF THE INVENTION

This invention includes a level sensitive circuit having a high degree of hysteresis in which an input signal is applied to the gate electrode of a first inverting amplifier. The inverting amplifier is initially isolated from at least one of its power supply sources and is selectively connected thereto after the level of the input has been altered. Multiple feedback paths are provided which aid in the selectivity and performance of the circuit. A first feedback path includes an output current amplifier which aids in increasing or decreasing the conductance of the input device by appropriately altering the gate-to-source voltage of the input device, as in the prior art. A second output responsive inverting amplifier sharing a common source voltage node with the input device controls the conductance of a device connected in series between the common source node and a source supply voltage. A second series device allows selective enabling of the circuit.

These and other aspects of the invention will be apparent from the detailed description of the invention, as illustrated in the accompanying drawings.

DESCRIPTION OF THE PREFERRED EMBODIMENT

Figure 1:
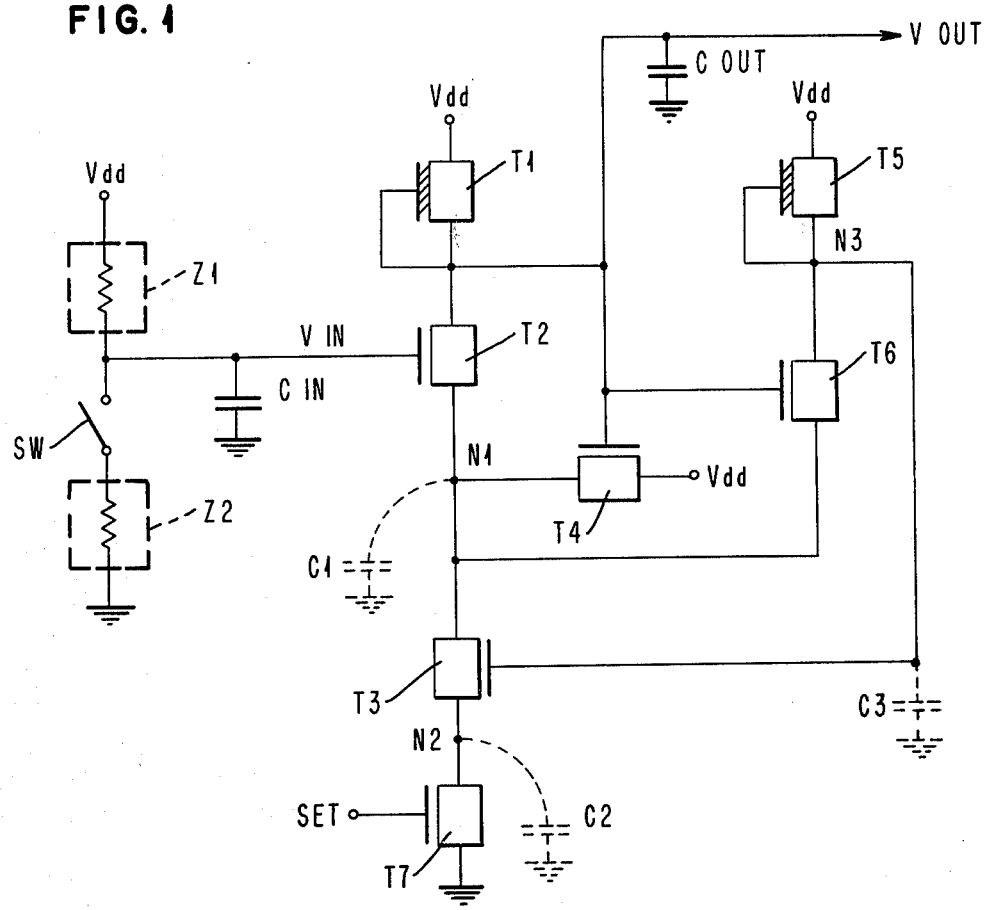
FIG. 1 is a circuit schematic of the level sensing circuit of the invention illustrating the various interconnections of the preferred IGFET embodiment.

Referring to FIG. 1, the level sensitive circuit is shown as embodied in n-channel IGFET technology, although various other transistor technologies can be used. In a first branch of the circuit, coupled between drain supply Vdd and common source node N1, is a first impedance, in the form of a depletion mode device T1, and a first enhancement mode transistor T2, which together act as a first inverter circuit. An input signal Vin applied to the gate of T2 appears as an inverted output signal at output terminal Vout. In a second branch of the circuit, also coupled between Vdd and node N1, is a second inverter circuit including a second impedance, in the form of depletion mode device T5, and a second enhancement mode transistor T6. The input to the second inverter corresponds to the output of the first inverter. The output of the second inverter appears at node N3. In a third branch of the circuit, also coupled between Vdd and node N1, is a third variable impedance in the form of a third enhancement mode transistor T4 which acts as a non-inverting or source follower amplifier responsive to the output of the first inverter. Common source node N1 is coupled to a source supply voltage, referenced to ground, by enhancement mode transistors T3 and T7. Device T3, having its current conducting electrodes coupled between voltage nodes N1 and N2, is responsive to signals at the output N3 of the second inverter circuit. Device T7, having its current conducting electrodes coupled between voltage node N2 and ground, is responsive to a circuit enabling signal SET.

The signal to be sensed Vin, applied to the control or gate electrode of T2, can be provided by any number of different circuit arrangements. As an example, the input signal is shown as being derived through a series circuit including a pair of impedances Z1 and Z2 and a switch SW coupled between a pair of voltage nodes, Vdd and ground. The steady state or DC potential of Vin will be dependent on whether or not switch SW is open or closed and the relative magnitudes of Z1 and Z2. The transient or AC potential of Vin will be dependent on the values of Z1 and Z2, the size of input capacitance C1 and the elapsed time between the opening or closing of SW and the time of measurement of Vin. In a ROM application Z1 is relatively large and Z2 is relatively small so that Vin will have a relatively large voltage swing. The open or closed state of switch SW is determined by the presence or absence of a transistor switching device at an addressed portion of an array of transistors or other switching devices.

The circuit operates as follows. During the period of time prior to enabling the sensing circuit the SET input is maintained below the threshold voltage of T7 keeping T7 in its non-conductive state. T1 charges output capacitance Cout to Vdd and T5 charges internal nodal capacitance C3, associated with node N3, to Vdd. The input Vin is charged to Vdd by impedance Z1 since switch SW is open. Devices T2, T4 and T6, all having their gate and drain electrodes connected to Vdd charge the internal nodal capacitance C1, associated with node N1, to Vdd less one IGFET threshold voltage drop (Vdd-Vt). Internal nodal capactance C2, associated with node C2, will be charged to Vdd-Vt by T3. After the internal capacitances are charged no current flows as all of the devices T1-T7 will be biased to be non-conductive.

In order to sense the level of Vin, the input SET is driven to a high logic level. Assuming that switch SW remains open when SET rises, the following events occur. T7 turns on, quickly pulling node N2 to ground. This causes the gate-to-source voltage of T3 to increase turning T3 on. T3 begins to discharge N1, which increases the gate-to-source voltage of T2, T4 and T6 turning them on. T2 causes Vout to fall, reducing the gate-to-source bias on T4 and T6, reducing the current they provide to node N1, which allows node N1 to be discharged faster and node N3 to be recharged to Vdd. As node N1 continues to fall, the output Vout also falls until all of nodes N1, N2 and Vout are discharged substantially to ground. The size of T1 is substantially smaller than that of T2, T3 and T7 to enhance the discharge rate of Vout and to enable Vout to reach nearly ground potential when T1, T2, T3 and T7 are all conductive. Since T7 acts primarily as a switch, it can be relatively larger than the other devices. Devices T3 and T4 should have size ratios determined by the desired switching point of the circuit, as described below. The size of T6 is less critical since any current it passes can be controlled by reducing the size of device T5.

In the event switch SW has been closed prior to the application of the input SET, input Vin will begin to discharge Cin toward ground, assuming Z2 is smaller than Z1. The reduction in Vin reduces the gate-to-source voltage of T2 biasing T2 off harder than it was initially. When input SET rises, turning on T7, node N2 discharges and increases the gate-to-source bias of T3 turning T3 on. T3 begins to discharge node N1, which in turn causes T4 and T6 to turn on. Since T2 is turned off harder than T4 or T6, T2 does not become conductive and the output remains at Vdd. Devices T3 and T4, both being biased in saturation, act as a voltage divider and prevent node N1 from discharging to a point less than the ratio of their sizes permit. When T4 and T3 are about equal in size, node N1 will stabilize at about Vdd/2, thus making the input level sensing turn on point Vdd/2+Vt. Although Vin is discharging at a rate less than that of N1, it reaches a value less than Vdd/2+Vt before node N1 reaches Vdd/2, maintaining T2 non-conductive and allowing Vout to remain at its initial value of Vdd. For the commonly used value of Vdd equal to 5.0 volts and a nominal value of Vt equal to 1.25 volts, Vin need only to discharge to 3.75 volts, or 1 Vt, before node N1 reaches Vdd/2 to ensure proper sensing of the state of Vin.

In some applications, it may be preferrable to eliminate device T4 and to allow devices T5 and T6 provide the required feedback and voltage divider action.

Figure 2:
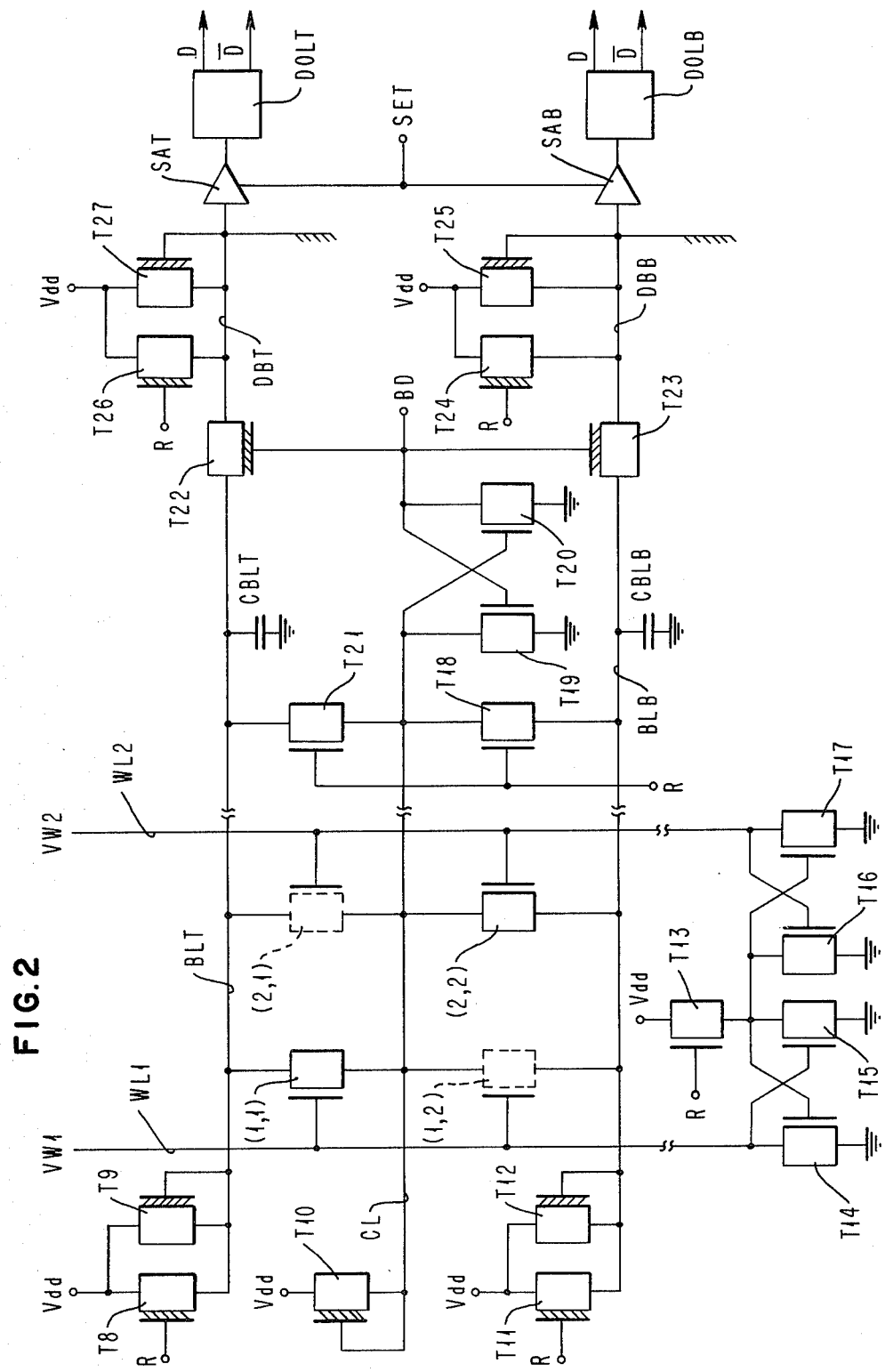
FIG. 2 is a circuit schematic drawing of an application of the level sensing circuit of FIG. 1 in a ROM integrated circuit memory device.

Referring now to FIG. 2 there is illustrated an application of the level sensing circuit of FIG. 1 in an IGFET ROM integrated circuit. The ROM array includes a matrix of nxm storage devices designated (n,m), only four positions of which are shown. Each storage device has its current conducting electrodes coupled between a bit line BLT or BLB and a common column line CL. The gate electrode of each storage device is coupled to a respective word line WLn. Application of a word line select voltage VWn enables the storage device to conduct current between a bit line and a column line only when a storage device is actually present. For example, storage devices (1,1) and (2,2) are present and storage devices (1,2) and (2,1), shown in phantom outline, are not present in the array. Coupled to each word line is a noise reduction circuit including devices T13–T17, see U.S. Pat. No. 3,810,124 to Hoffman, which keeps the word lines grounded unless they are selected. Each bit line is restored to drain supply voltage Vdd by a pair of depletion mode devices T8 and T9 or T11 and T12. Devices T8 and T11 are responsive to restore pulse R during standby operation. The column lines are restored to Vdd by a single depletion mode device, for example T10. Coupled between each bit line and its respective column line is a charge balancing device T21 or T18 which is also responsive to restore pulse R. Column or bit-wise addressing is achieved through a decoded bit drive pulse BD which is applied to a cross-coupled pair of devices T19 and T20. Each of the bit lines is coupled through a bit drive pulse responsive depletion device T22 or T23 to one of two common data buses, data bus top DBT or data bus bottom DBB. The data buses are restored by a pair of depletion devices T26 and T27 or T24 and T25 in a manner similar to the bit lines. Each data bus is, in turn coupled to the input of a level sensitive amplifier of FIG. 1, designated SAT and SAB. The amplifiers are responsive to the input SET, as previously described. The output of each amplifier is coupled to a data out latch DOLT or DOLB which generates both true and complement data D and $\bar{D}$.

Figure 3:
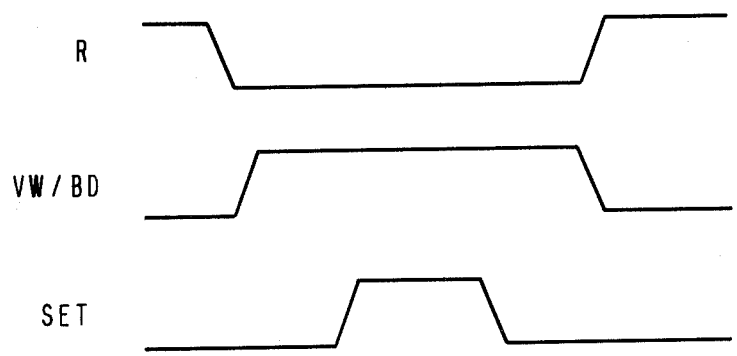
FIG. 3 is a pulse program for operating the embodiment of FIG. 2.

The operation of the circuit in FIG. 2 is described in conjunction with the simplified pulse program shown in FIG. 3. During unselected or standby periods restore pulse R is high while word and bit selection pulses VW and BD are low as is amplifier controlling pulse SET. During the time restore pulse R is high, all of the bit lines BLT and BLB, the column lines CL and the data bus lines DBT and DBB are restored to Vdd. The word lines WL and bit select lines BD are held at zero volts or ground. When the integrated circuit chip is selected restore pulse R falls to its low level and address responsive word and bit lines are driven to their high state. For example, if memory device (1,1) is to be selected word line WL1 and bit driver line BD are driven high. The bit driver pulse BD causes device T19 to turn on and clamps column line CL to ground. Memory device (1,1) having a high level on its gate and a grounded source turns on and begins to discharge the precharged bit line capacitance CBLT. Memory device (1,2) not being physically present in the array causes no change to precharged bit capacitance CBLB. Bit switches T22 and T23 allow the signals on their respective bit line to be coupled to the precharged common data buses at the inputs to the level sensitive amplifiers SAT and SAB. After a short delay period from the rising of WL/BD the SET pulse rises enabling SAT and SAB. The falling signal applied to bit line BLT is sensed as a low level input to SAT which enables data out latch DOLT to set the appropriate levels of data out at its output. Since bit line BLB is not discharged, bottom sense amplifier SAB senses a high level input and applies the appropriate signal to data out latch DOLB. Once the levels of the data signals on the data buses has been sensed, the SET pulse returns to its low level followed by the return of the VW/DB lines to their low levels. Restore pulse R again rises to precharge the circuitry for another selection cycle.

It will be understood by those skilled in the art that various alterations and modifications in the circuit of the invention may be easily made. For example, different types of IGFET or bipolar processing technologies such as p-channel or CMOS can be substituted for the preferred n-channel technology. ROM storage devices may be programmed to be present or absent in the ROM array by a variety of known techniques such as the severing, or failure to provide, any of the three electrodes required for conduction or by modifying the device structure or operating characteristics so the devices are selectively conductive or not conductive under the same biasing voltages.

What is claimed is:

1. A voltage level responsive circuit including first and second inverter circuits, each coupled between a voltage source and a common voltage node, each inverter including an input responsive device and a first impedance means, the input of the first inverter being responsive to an input signal and the output of the first inverter being coupled to the input of the second inverter, characterized by a first switching means having a control electrode and two current conducting electrodes, the current conducting electrodes being coupled between the common voltage node and a reference voltage node, and means coupling the output of the second inverter to the control electrode of the first switching means; and a second switching means coupled between the reference voltage node and a source of reference voltage, the second switching means being responsive to a circuit enabling signal to selectively apply power to the voltage level responsive circuit.

2. The level responsive circuit of claim 1 further including second impedance means for causing positive feedback between the output of the first inverter and the common voltage node.

3. The level responsive circuit of claim 2 wherein the second impedance means comprises a three-terminal semiconductor device having a pair of current conducting electrodes and a control electrode.

4. The level responsive circuit of claim 3 wherein the three-terminal semiconductor device has its current conducting electrodes coupled between the voltage source and the common voltage node and its control electrode coupled to the output of the first inverter.

5. The level responsive circuit of claim 1 wherein each of the input responsive devices, first impedance means and switching means are IGFET devices.

6. A level sensitive data signal sensing circuit for an integrated memory circuit including an array of addressable memory devices, at least one of which when addressed will cause the voltage on a precharged data sense line to be changed, the data signal sensing circuit having an input coupled to the data sense line and being enabled by an amplifier set signal after the selection of an addressed memory device, the signal sensing circuit characterized in that the data signal sensing circuit includes:

a first data signal responsive inverter circuit coupled between a first source of supply voltage and a common voltage node, the output of the first inverter corresponding to the sensed data signal, a second inverter circuit coupled between the first source of supply voltage and the common voltage node, the input of the second inverter circuit being coupled to the output of the first inverter circuit, and a series circuit coupling the common voltage node to a second source of supply voltage, the series circuit including an amplifier set signal-responsive switching device and a voltage responsive current conducting device having a control electrode coupled to the output of the second inverter circuit.

7. The data signal sensing circuit of claim 6 wherein the first and second inverter circuits, the switching device and the current conducting device all comprise IGFET devices.

8. The data signal sensing circuit of claim 7 further including an IGFET device having a gate electrode and two current conducting electrodes, the gate electrode coupled to the output of the first inverter and the current conducting electrodes coupled between the first source of supply voltage and the common voltage node.

* * * * *